(12) United States Patent
Yang et al.

(10) Patent No.: US 10,825,851 B2
(45) Date of Patent: Nov. 3, 2020

(54) SENSOR PACKAGE STRUCTURE

(71) Applicant: KINGPAK TECHNOLOGY INC., Hsin-Chu County (TW)

(72) Inventors: Sheng Yang, Hsin-Chu County (TW); Li-Chun Hung, Hsin-Chu County (TW); Hsiu-Wen Tu, Hsin-Chu County (TW); Jo-Wei Yang, Hsin-Chu County (TW); Chien-Chen Lee, Hsin-Chu County (TW); Jian-Ru Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 16/390,280

(22) Filed: Apr. 22, 2019

(65) Prior Publication Data

US 2020/0119070 A1    Apr. 16, 2020

(30) Foreign Application Priority Data

Oct. 11, 2018  (CN) .......................... 2018 1 1183324

(51) Int. Cl.
*H01L 23/498* (2006.01)
*H01L 27/146* (2006.01)
(Continued)

(52) U.S. Cl.
CPC ...... *H01L 27/14618* (2013.01); *H01L 23/498* (2013.01); *H01L 27/14636* (2013.01);
(Continued)

(58) Field of Classification Search
CPC ....... H01L 23/498; H01L 23/28; H01L 23/31; H01L 23/3121; H01L 23/3128; H01L 23/315; H01L 23/3157; H01L 23/04; H01L 23/041; H01L 23/06; H01L 23/08; H01L 27/14618; H01L 24/42–49; H01L 2224/48221–4824; H01L 24/26–33;
(Continued)

(56) References Cited

U.S. PATENT DOCUMENTS

| 6,191,359 | B1 * | 2/2001 | Sengupta | ................ H01L 23/10 |
| | | | | 174/538 |
| 6,483,030 | B1 * | 11/2002 | Glenn | ..................... B29C 43/36 |
| | | | | 174/521 |

(Continued)

*Primary Examiner* — Sonya McCall-Shepard
(74) *Attorney, Agent, or Firm* — Li & Cai Intellectual Property (USA) Office

(57) ABSTRACT

A sensor package structure includes a substrate, a sensor chip disposed on the substrate, a plurality of metal wires electrically connecting the substrate and the sensor chip, a glass cover disposed on the sensor chip, and an adhesive layer connecting the glass cover to the substrate. The substrate is made of a material having a coefficient of thermal expansion (CTE) that is less than 10 ppm/° C. The glass cover includes a board body and an annular supporting body connected to the board body. The annular supporting body of the glass cover is fixed onto the substrate through the adhesive layer, so that the glass cover and the substrate jointly surround an enclosed accommodating space. The sensor chip and the metal wires are arranged in the accommodating space, and the sensing region of the sensor chip faces the light-permeable portion of the board body.

7 Claims, 7 Drawing Sheets

(51) Int. Cl.
*H01L 23/00* (2006.01)
*H01L 23/31* (2006.01)
*H01L 23/04* (2006.01)

(52) U.S. Cl.
CPC .............. *H01L 23/04* (2013.01); *H01L 23/31* (2013.01); *H01L 24/26* (2013.01); *H01L 24/42* (2013.01); *H01L 2224/26* (2013.01); *H01L 2224/2901* (2013.01); *H01L 2224/48221* (2013.01)

(58) Field of Classification Search
CPC ........................... H01L 2224/26–26175; H01L 2224/2901–29036
See application file for complete search history.

(56) References Cited

U.S. PATENT DOCUMENTS

| | | | | |
|---|---|---|---|---|
| 7,005,720 | B2* | 2/2006 | Huang | H01L 27/14618 257/432 |
| 7,091,571 | B1* | 8/2006 | Park | H01L 27/14618 257/432 |
| 7,344,915 | B2* | 3/2008 | Appelt | H01L 23/13 257/684 |
| 7,729,606 | B2* | 6/2010 | Webster | G02B 7/023 396/144 |
| 10,048,118 | B2* | 8/2018 | Park | H01L 27/14634 |
| 2002/0060287 | A1* | 5/2002 | Ho | H01L 31/0203 250/239 |
| 2003/0201507 | A1* | 10/2003 | Chen | H01L 27/14618 257/433 |
| 2004/0080037 | A1* | 4/2004 | Foong | H01L 27/14634 257/687 |
| 2004/0113221 | A1* | 6/2004 | Hsieh | H01L 27/14618 257/433 |
| 2005/0073036 | A1* | 4/2005 | Appelt | H01L 31/0203 257/678 |
| 2009/0273072 | A1* | 11/2009 | Nakada | H01L 24/85 257/692 |
| 2012/0314126 | A1* | 12/2012 | Liu | H01L 27/14618 348/374 |
| 2014/0264699 | A1* | 9/2014 | Ryu | H01L 27/14618 257/434 |
| 2015/0035133 | A1* | 2/2015 | Wong | H01L 23/04 257/704 |
| 2015/0232325 | A1* | 8/2015 | Chou | B81B 7/0061 257/416 |
| 2015/0256726 | A1* | 9/2015 | Kaioka | G01B 11/272 348/360 |
| 2017/0092680 | A1* | 3/2017 | Kwon | H01L 23/5226 |
| 2017/0365632 | A1* | 12/2017 | Tu | H01L 31/0203 |
| 2020/0051954 | A1* | 2/2020 | Kim | H01L 27/1469 |

* cited by examiner

SENSOR PACKAGE STRUCTURE

CROSS-REFERENCE TO RELATED PATENT APPLICATION

This application claims the benefit of priority to China Patent Application No. 201811183324.8, filed on Oct. 11, 2018 in People's Republic of China. The entire content of the above identified application is incorporated herein by reference.

FIELD OF THE DISCLOSURE

The present disclosure relates to a package structure, and more particularly to a sensor package structure.

BACKGROUND OF THE DISCLOSURE

In order to efficiently increase sensing sensitivity, a sensor chip (e.g., a CMOS chip or a CCD chip) needs to be comparatively improved in aspects of pixel resolution, light sensitivity, and logic processing. For offering sensing performance with better quality, the size of the sensor chip has to be increased accordingly. However, after the large-sized sensor chip is packaged, the size of a conventional sensor package structure will be made even larger, so that serious warpage or stress is easily incurred within the conventional sensor package structure during temperature changes, which reduces reliability of the conventional sensor package structure.

SUMMARY OF THE DISCLOSURE

In response to the above-referenced technical inadequacies, the present disclosure provides a sensor package structure which improves the conventional sensor package structures.

In one aspect, the present disclosure provides a sensor package structure, which includes a substrate, a sensor chip, a plurality of metal wires, a glass cover, and an adhesive layer. The substrate is made of a material with a coefficient of thermal expansion (CTE) that is less than 10 ppm/° C. The sensor chip is disposed on the substrate, and a top surface of the sensor chip has a sensing region. The metal wires electrically connect the substrate and the sensor chip. The glass cover includes a board body and an annular supporting body. The board body has a light-permeable portion and an annular portion arranged around the light-permeable portion. The annular supporting body is connected to the annular portion of the board body. The annular supporting body of the glass cover is disposed on the substrate, and the glass cover and the substrate jointly surround an enclosed accommodating space. The sensor chip and the metal wires are arranged in the accommodating space, and the sensing region of the sensor chip faces the light-permeable portion of the board body. The adhesive layer connects the annular supporting body to the substrate.

In one aspect, the present disclosure provides a sensor package structure, which includes a substrate, a sensor chip, a plurality of metal wires, a glass cover, an adhesive layer, and at least one protecting body. The substrate is made of a material with a coefficient of thermal expansion (CTE) that is less than 10 ppm/° C. The sensor chip is disposed on the substrate, and a top surface of the sensor chip has a sensing region. The metal wires electrically connect the substrate and the sensor chip. The glass cover includes a board body and a plurality of elongated supporting bodies. The board body has a light-permeable portion and an annular portion arranged around the light-permeable portion. The annular portion includes a plurality of connecting segments and at least one hanging segment. The elongated supporting bodies are respectively connected to the connecting segments of the annular portion of the board body. The elongated supporting bodies of the glass cover are disposed on the substrate, the metal wires are arranged under the at least one hanging segment of the annular portion, and the sensing region of the sensor chip faces the light-permeable portion of the board body. The adhesive layer connects the elongated supporting bodies to the substrate. The at least one protecting body is disposed on the substrate and connected to the at least one hanging segment so as to embed the metal wires and portions of the sensor chip connected to the metal wires therein. The glass cover, the substrate, and the at least one protecting body jointly surround an enclosed accommodating space, and the sensing region of the sensor chip is arranged in the accommodating space.

According to above, the structural strength of the sensor package structure of the present disclosure can be reinforced via the glass cover, and the substrate of the sensor package structure may be selected as one having a lower CTE that is less than 10 ppm/° C., thereby effectively preventing warpage of the sensor package structure from occurring and increasing reliability of the sensor package structure.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Please refer to FIG. 1 to FIG. 6, which illustrate embodiments of the present disclosure. It should be noted that associated numbers and appearance mentioned by the drawings corresponding to the embodiments are simply used for specifically illustrating implementation of the embodiments in the disclosure and making the disclosure more understandable, not for limiting the protection scope of the disclosure.

First Embodiment

Figure 1:
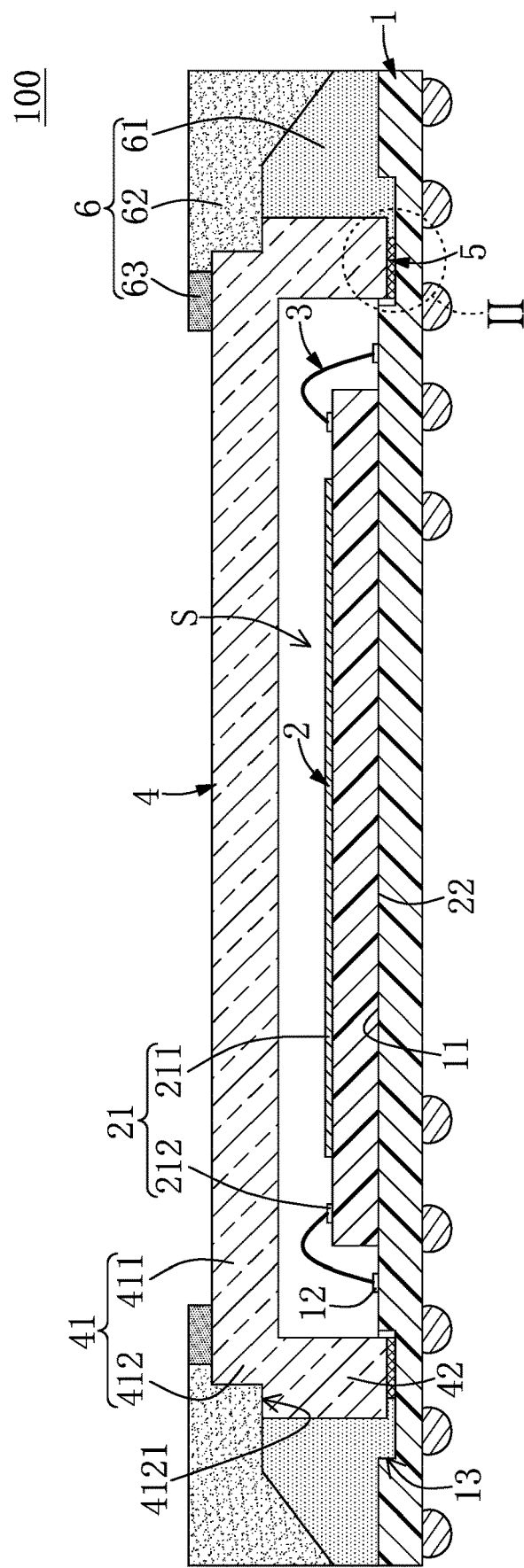
FIG. 1 is a cross-sectional view of a sensor package structure according to a first embodiment of the present disclosure.
Figure 2:
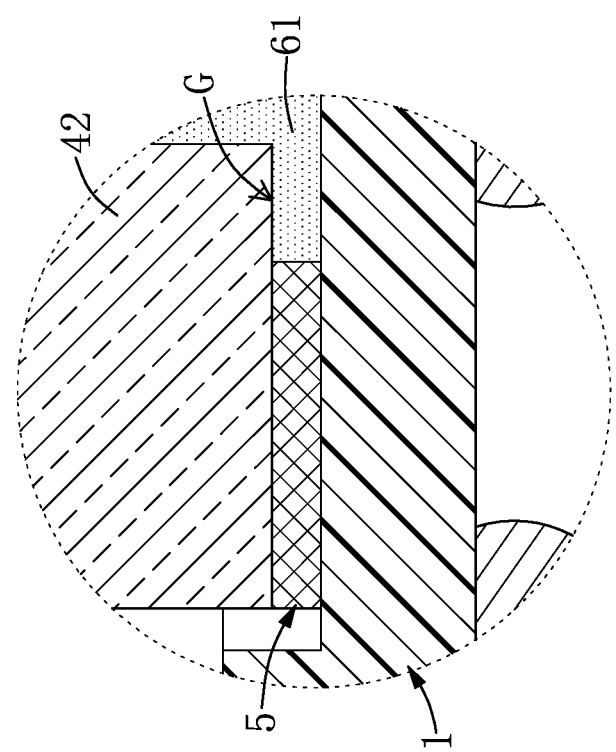
FIG. 2 is an enlarged view of portion II of FIG. 1.

Referring to FIG. 1 and FIG. 2, a first embodiment of the present disclosure provides a sensor package structure 100. The sensor package structure 100 includes a substrate 1, a sensor chip 2 disposed on the substrate 1, a plurality of metal wires 3 electrically connecting the substrate 1 and the sensor chip 2, a glass cover 4 covering the sensor chip 2 and the metal wires 3, an adhesive layer 5 connecting the glass cover 4 and the substrate 1, and a package body 6 disposed on the substrate 1. In other embodiments not shown in the present disclosure, the sensor package structure 100 can be provided without the package body 6.

It should be noted that, the drawings of the present embodiment are cross-sectional views for the sake of easily describing the sensor package structure 100 of the present embodiment, and portions of the sensor package structure 100 not shown in the drawings shall have corresponding structures. For example, FIG. 1 shows only two of the metal wires 3, but portions of the sensor package structure 100 not shown in FIG. 1 includes other metal wires 3. The structure and connection relationship of each component of the sensor package structure 100 will be recited in the following context.

The substrate 1 is made of a material with a coefficient of thermal expansion (CTE) that is less than 10 ppm/° C. (e.g., the CTE of a silicone substrate is 2.6 ppm/° C.). It should be noted that, the substrate 1 of the present embodiment should not be formed of a glass, but the CTE of the substrate 1 is preferably close to the CTE of glass (i.e., 7.2 ppm/° C.).

Specifically, the substrate 1 of the present embodiment is in a square shape or a rectangular shape. A top surface of the substrate 1 includes a chip-bonding region 11 arranged on a substantially center portion thereof, and the substrate 1 includes a plurality of first pads 12 which are disposed on the top surface and at periphery of the chip-bonding region 11. Moreover, the substrate 1 has an annular groove 13. The annular groove 13 in the present embodiment is recessed from the top surface of the substrate 1 and is arranged around the first pads 12 (or the chip-bonding region 11).

In addition, the substrate 1 is further provided with a plurality of solder balls (not labeled) disposed on a bottom surface thereof. The substrate 1 can be soldered onto an electronic component (e.g., a printed circuit board) through the solder balls, thereby electrically connecting the sensor package structure 100 to the electronic component.

The sensor chip 2 in the present embodiment is an image sensing chip, but the present disclosure is not limited thereto. The sensor chip 2 includes a top surface 21 and a bottom surface 22 opposite to the top surface 21. The top surface 21 of the sensor chip 2 has a sensing region 211 arranged on a substantial center portion thereof. The sensor chip 2 includes a plurality of second pads 212 which are disposed on the top surface 21 and at periphery of the sensing region 211, and the number and positions of the second pads 212 correspond to those of the first pads 12. Moreover, the sensor chip 2 is disposed on the substrate 1. In the present embodiment, the bottom surface 22 of the sensor chip 2 is fixed onto the chip-bonding region 11 of the substrate 1 through an adhesive (not labeled).

Each of the metal wires 3 has a first end and an opposite second end, the first ends of the metal wires 3 are respectively connected to the first pads 12 of the substrate 1, and the second ends of the metal wires 3 are respectively connected to the second pads 212 of the sensor chip 2, so that the substrate 1 and the sensor chip 2 can be electrically connected to each other through the metal wires 3.

The glass cover 4 includes a board body 41 and an annular supporting body 42 perpendicularly connected to the board body 41. The board body 41 is in a flat status, and includes a light-permeable portion 411 and an annular portion 412 arranged around the light-permeable portion 411. The annular supporting body 42 is connected to the annular portion 412 of the board body 41, and the annular supporting body 42 corresponds in shape to the annular groove 13 of the substrate 1.

It should be noted that, the glass cover 4 in the present embodiment is integrally formed as a one-piece structure, but the present disclosure is not limited thereto. For example, in other embodiments not shown in the present disclosure, the annular supporting body 42 can be fixed to the annular portion 412 of the board body 41 through an adhesive.

The annular supporting body 42 of the glass cover 4 is disposed on the substrate 1, and the annular supporting body 42 in the present embodiment is adhered to the substrate 1 through the adhesive layer 5 that is in an annular shape, so that the glass cover 4 and the substrate 1 (and the adhesive layer 5) jointly surround an enclosed accommodating space S. The sensor chip 2 and the metal wires 3 are arranged in the accommodating space S, and the sensing region 211 of the sensor chip 2 faces the light-permeable portion 411 of the board body 41.

Specifically, as shown in FIG. 2, an outer lateral side of the adhesive layer 5 is retracted from an outer lateral side of the annular supporting body 42 by a distance, so that a gap G in an annular shape is formed among the outer lateral side of the adhesive layer 5, the substrate 1, and a bottom side of the annular supporting body 42. However, in other embodiments not shown in the present disclosure, the adhesive layer 5 can be adhered to the bottom side of the annular supporting body 42 entirely, so that no gap exists between the bottom side of the annular supporting body 42 and the substrate 1.

Moreover, the annular supporting body 42 in the present embodiment is disposed in the annular groove 13, and the adhesive layer 5 is arranged in the annular groove 13, but the present disclosure is not limited thereto. For example, in other embodiments not shown in the present disclosure, the top surface of the substrate 1 can be formed without the annular groove 13.

The package body 6 surrounds at peripheries of the glass cover 4 and the adhesive layer 5, and the light-permeable portion 411 of the glass cover 4 is exposed from the package body 6. That is to say, the annular portion 412 of the board body 41 of the glass cover 4 and the annular supporting body 42 are covered by the package body 6. Moreover, the package body 6 is filled within the gap G and connects with the outer lateral side of the adhesive layer 5, the substrate 1, and the bottom side of the annular supporting body 42.

Specifically, the glass cover 4 has an annular notch 4121 recessed in the annular portion 412. The package body 6 in the present embodiment includes a bottom package portion 61 disposed on the substrate 1, a top package portion 62 disposed on a top side of the bottom package portion 61, and an annular retaining wall 63 disposed on a top surface of the glass cover 4.

The bottom package portion 61 is formed by solidifying a liquid compound and does not extend into the annular notch 4121. The top package portion 62 is formed by a molding compound. The top package portion 62 fully fills the annular notch 4121 and connects with an outer lateral side of the retaining wall 63. In other words, the top package portion 62 covers a part of the top surface of the glass cover 4. The retaining wall 63 in the present embodiment is at least partially arranged above the annular supporting body 42, but the present disclosure is not limited thereto.

In other embodiments not shown in the present disclosure, the glass cover 4 can be formed without the annular notch 4121; the package body 6 can be formed without the retaining wall 63 and does not cover the top surface of the glass cover 4; or the package body 6 can be formed without the retaining wall 63, and the bottom package portion 61 and the top package portion 62 are formed by the same molding encapsulating resin and do not cover the top surface of the glass cover 4.

Second Embodiment

Figure 3:
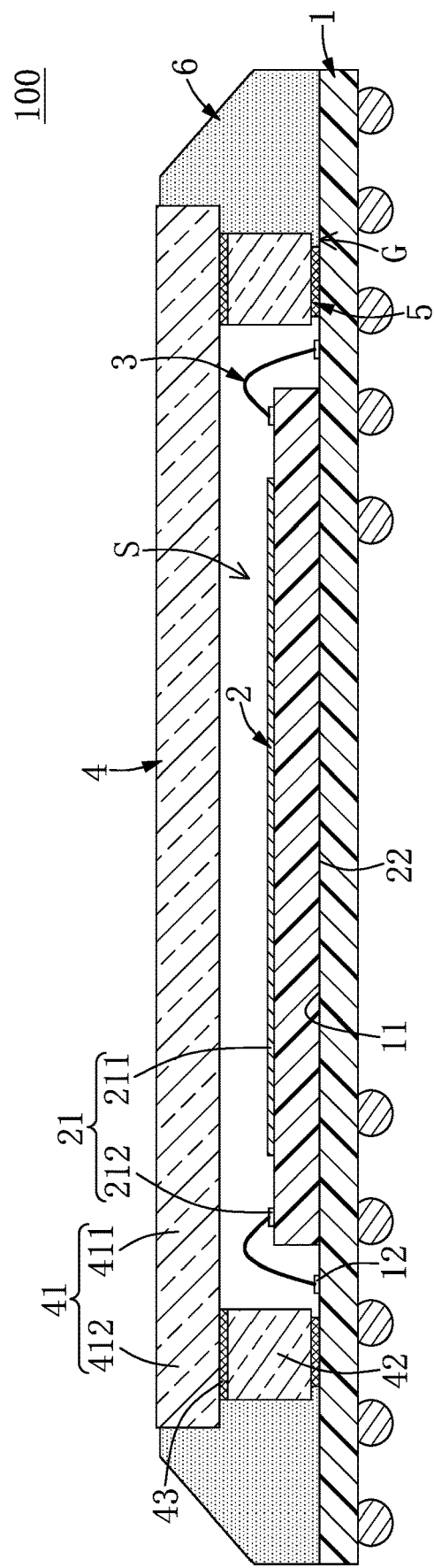
FIG. 3 is a cross-sectional view of a sensor package structure according to a second embodiment of the present disclosure.

Referring to FIG. 3 in which a second embodiment of the present disclosure is illustrated. The second embodiment is similar to the first embodiment, and therefore identical parts of these two embodiments shall not be recited. The main differences between the second and the first embodiments are as follows.

In the present embodiment, the substrate 1 is provided without the annular groove 13, and the package body 6 is formed by solidifying only a liquid compound, but the present disclosure is not limited thereto. For example, in other embodiments not shown in the present disclosure, the package body 6 can be formed only by a molding compound.

Moreover, the glass cover 4 is not an integrally formed one-piece structure, but further includes a bonding layer 43 that connects the board body 41 and the annular supporting body 42. An outer lateral side of the annular portion 412 of the board body 41 protrudes from the annular supporting body 42, and at least part of the outer lateral side of the annular portion 412 is covered by the package body 6.

Third Embodiment

Figure 4:
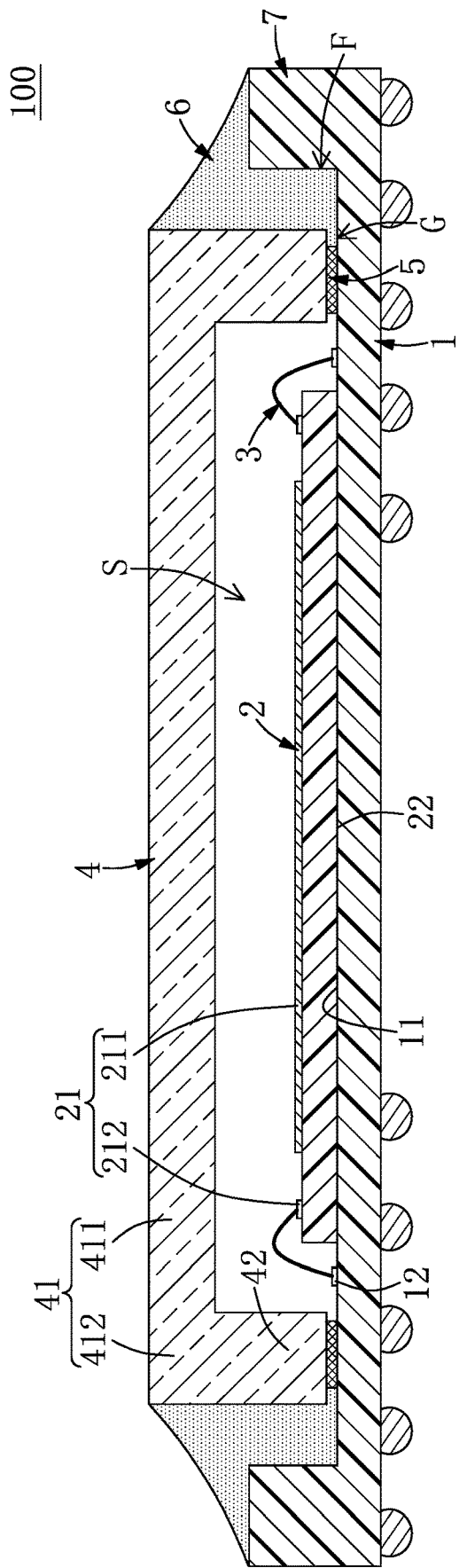
FIG. 4 is a cross-sectional view of a sensor package structure according to a third embodiment of the present disclosure.

Referring to FIG. 4, in which a third embodiment of the present disclosure is illustrated. The third embodiment is similar to the second embodiment, and therefore identical parts of these two embodiments shall not be recited. The main differences between the third and the second embodiments are as follows.

In the present embodiment, the glass cover 4 is an integrally formed one-piece structure, and an outer lateral side of the annular portion 412 of the board body 41 is flush with an outer lateral side of the annular supporting body 42. Moreover, the sensor package structure 100 further includes a surrounding wall 7 disposed on the substrate 1. The surrounding wall 7 in the present embodiment is integrally formed on a periphery portion of the top surface of the substrate 1, and a height of the surrounding wall 7 with respect to the top surface of the substrate 1 is preferably lower than a height of the glass cover 4 (or the annular supporting body 42) with respect to the top surface of the substrate 1, but the present disclosure is not limited thereto.

Specifically, the surrounding wall 7 is in an annular shape. The annular supporting body 42 is separately arranged in the interior of the surrounding wall 7 so as to form with an annular filling slot F, and the filling slot F is fully filled with the package body 6. The filling slot F in the present embodiment is in spatial communication with the gap G, and the filling slot F and the gap G are fully filled with the package body 6.

Fourth Embodiment

Figure 5:
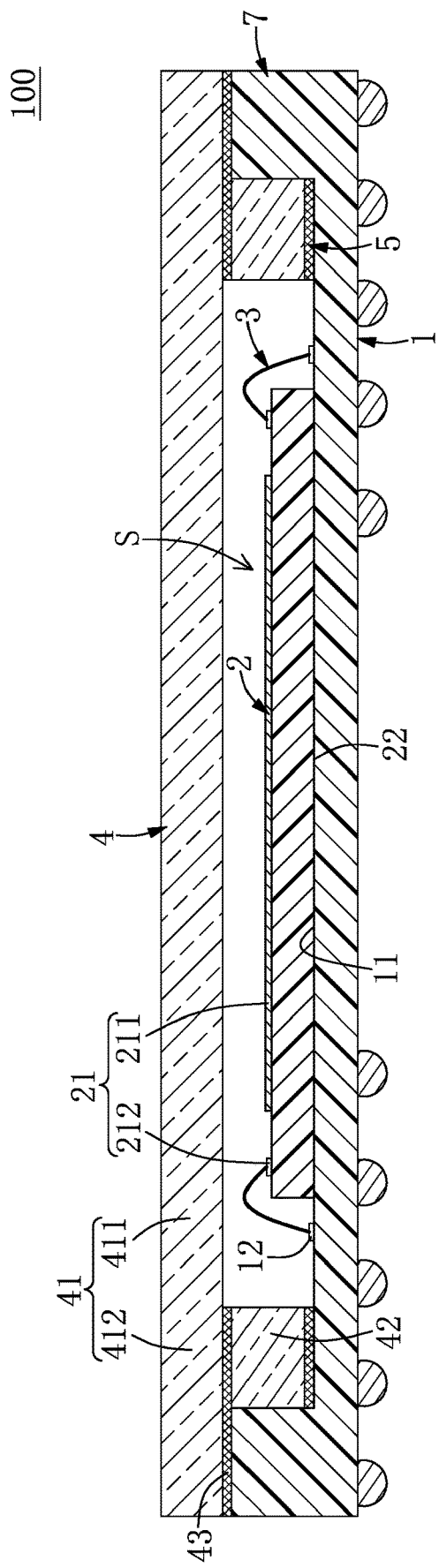
FIG. 5 is a cross-sectional view of a sensor package structure according to a fourth embodiment of the present disclosure.

Referring to FIG. 5, in which a fourth embodiment of the present disclosure is illustrated. The fourth embodiment is similar to the second embodiment, and therefore identical parts of these two embodiments shall not be recited. The main differences between the fourth and the second embodiments are as follows.

In the present embodiment, the sensor package structure 100 is provided without the package body 6, and the sensor package structure 100 includes a surrounding wall 7 disposed on the substrate 1. The surrounding wall 7 in the present embodiment is in an annular shape, and is integrally formed on a periphery portion of the top surface of the substrate 1. A height of the surrounding wall 7 with respect to the top surface of the substrate 1 is preferably equal to a height of the annular supporting body 42 with respect to the top surface of the substrate 1, but the present disclosure is not limited thereto.

Moreover, the annular supporting body 42 is arranged in the interior of the surrounding wall 7 and adjacent to an inner side of the surrounding wall 7. In addition, an outer lateral side of the annular portion 412 protrudes from the annular supporting body 42, and the outer lateral side of the annular portion 412 in the present embodiment is flush with that of the surrounding wall 7. The board body 41 is connected to the annular supporting body 42 and a top side of the surrounding wall 7 through the bonding layer 43.

Fifth Embodiment

Figure 6:
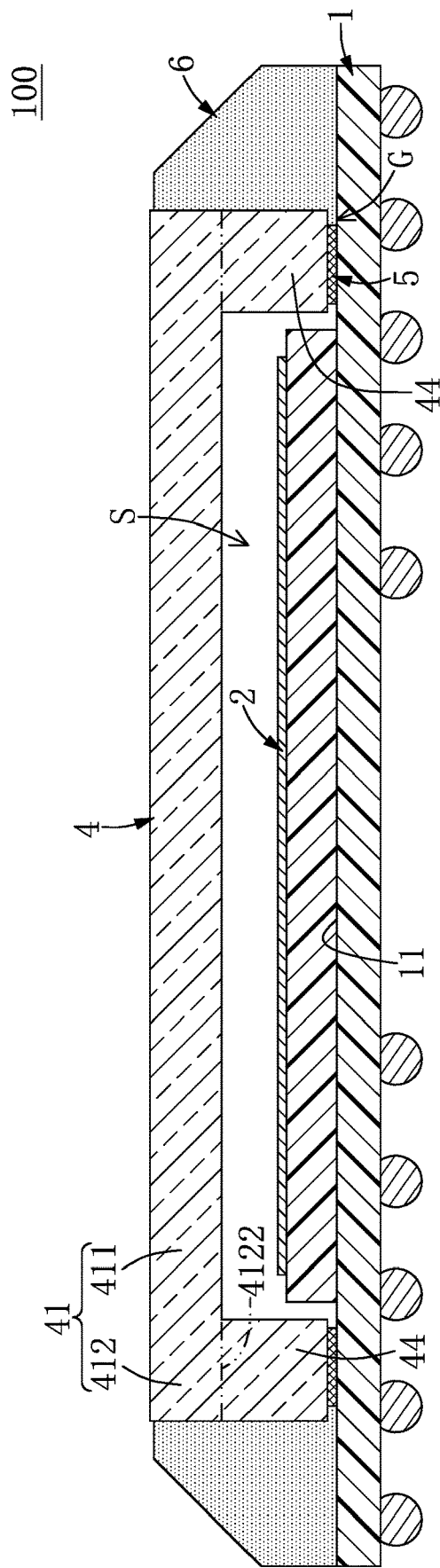
FIG. 6 is a cross-sectional view of a sensor package structure according to a fifth embodiment of the present disclosure.
Figure 7:
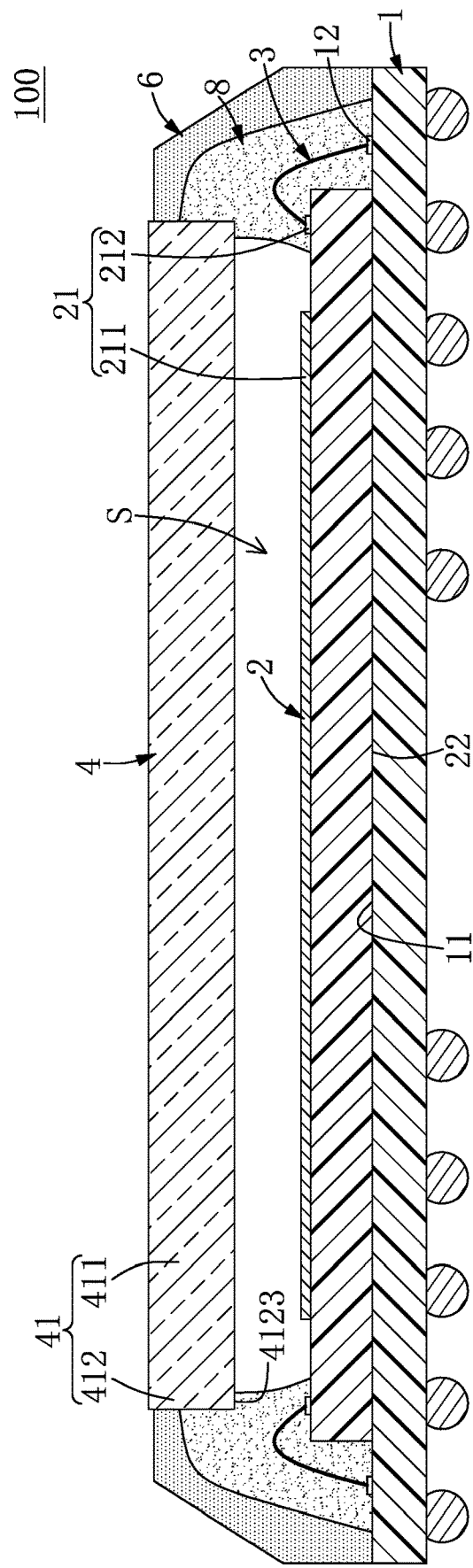
FIG. 7 is a cross-sectional view of the sensor package structure in another viewing angle according to the fifth embodiment of the present disclosure.

Referring to FIG. 6 and FIG. 7, a fifth embodiment of the present disclosure provides a sensor package structure 100. The sensor package structure 100 includes a substrate 1, a sensor chip 2 disposed on the substrate 1, a plurality of metal wires 3 electrically connecting the substrate 1 and the sensor chip 2, a glass cover 4 disposed on the substrate 1, an adhesive layer 5 connecting the glass cover 4 and the substrate 1, at least one protecting body 8 disposed on the substrate 1 and connected to the glass cover 4, and a package body 6 disposed on the substrate 1. In other embodiments not shown in the present disclosure, the sensor package structure 100 can be provided without the package body 6.

It should be noted that, the drawings of the present embodiment are two cross-sectional views along two planes orthogonal to each other, which is for conveniently illustrating the sensor package structure 100 of the present embodiment. It could also be realized that the unplotted portions of the sensor package structure 100 shall have corresponding structures that can be formed according to the cross-sectional views. For example, FIG. 7 shows only two of the metal wires 3, but the portions, not shown in FIG. 7, of the sensor package structure 100 includes other metal wires 3. The structure and connection relationship of each component of the sensor package structure 100 will be recited as follows.

The substrate 1, the sensor chip 2, and the metal wires 3 in the present embodiment are similar to those in the first embodiment, so the identical parts shall not be recited. It should be noted that, on the top surface 21 of the sensor chip 2 in the present embodiment, only a partial periphery of the sensing region 211 is provided with the second pads 212. The rest of the periphery of the sensing region 211 is identified as a non-wiring region. Moreover, the number and positions of the first pads 12 correspond to those of the second pads 212.

The glass cover 4 includes a board body 41 and a plurality of elongated supporting bodies 42 respectively and perpendicularly connected to the board body 41. The board body 41 is in a flat status, and includes a light-permeable portion 411 and an annular portion 412 arranged around the light-permeable portion 411. The annular portion 412 includes a plurality of connecting segments 4122 and at least one hanging segment 4123. In other words, the connecting segments 4122 and the at least one hanging segment 4123 are connected together in a head-to-tail manner to construct the annular portion 412. It should be noted that, there are two connecting segments 4122 and two hanging segments 4123 in the present embodiment, which is for illustrating the present embodiments, but the present disclosure is not limited thereto.

Moreover, the elongated supporting bodies 44 are respectively connected to the connecting segments 4122 of the annular portion 412, and the heights of the elongated supporting bodies 44 with respect to the board body 41 are roughly the same in the present embodiment. The glass cover 4 is an integrally formed one-piece structure, but the present disclosure is not limited thereto. For example, in other embodiments not shown in the present disclosure, any one of the elongated supporting bodies 44 can be fixed onto the corresponding connecting segment 4122 through an adhesive.

The glass cover 4 is disposed on the substrate 1 via the elongated supporting bodies 44, and the adhesive layer 5 adheres the elongated supporting bodies 44 with the substrate. In other words, the adhesive layer 5 includes a plurality of portions respectively adhered to the elongated supporting bodies 44. The metal wires 3 are arranged under the hanging segments 4123 of the annular portion 412, and the sensing region 211 of the sensor chip 2 faces the light-permeable portion 411 of the board body 41. Accordingly, a space surrounded by the glass cover 4 and the substrate 1 can be sealed by using the protecting bodies 8 under the hanging segments 4123.

It should be noted that the number of the protecting bodies 8 in the sensor package structure 100 is the same as the number of the hanging segments 4123. That means, the number of the protecting bodies 8 in the sensor package structure 100 is also two (as shown in FIG. 7), but the present disclosure is not limited thereto. For example, in other embodiments not shown in the present disclosure, there are at least one protecting body 8 and at least one hanging segment 4123; the at least one protecting body 8 is connected to the substrate 1 and the at least one hanging segment 4123, so that the glass cover 4, the substrate 1, the at least one protecting body 8 jointly surround an enclosed accommodating space S.

In the present embodiment, the two protecting bodies 8 are disposed on the substrate 1 and are respectively connected to the two hanging segments 4123 so as to embed the metal wires 3 and the second pads 212 of the sensor chip 2 therein. Moreover, the glass cover 4, the substrate 1, the two protecting bodies 8 jointly surround the enclosed accommodating space S, and the sensing region 211 of the sensor chip 2 is arranged in the accommodating space S. In addition, the material of the protecting bodies 8 in the present embodiment is an adhesive so as to ensure the accommodating space S in an enclosed state, but the present disclosure is not limited thereto.

The package body 6 is arranged around the glass cover 4, the adhesive layer 5, and the two protecting bodies 8, and the light-permeable portion 411 of the glass cover 4 is exposed from the package body 6. In other words, the annular portion 412 of the board body 41, the elongated supporting bodies 44 of the glass cover 4 and the two protecting bodies 8 are covered by the package body 6. The package body 6 in the present embodiment is formed by solidifying a liquid compound, but the present disclosure is not limited thereto.

Specifically, the outer lateral side of the adhesive layer 5, the substrate 1, and a bottom side of each of the elongated supporting bodies 44 jointly surround a gap G. Moreover, the gap G is filled with the package body 6 so as to contact the outer lateral side of the adhesive layer 5, the substrate 1, and the bottom side of the corresponding elongated supporting body 44. However, in other embodiments not shown in the present disclosure, the adhesive layer 5 can be adhered to the entire bottom side of each of the elongated supporting bodies 44, so that no gap exists between the bottom side of each of the elongated supporting bodies 44 and the substrate 1.

In conclusion, the structural strength of the sensor package structure of the present disclosure can be reinforced by the glass cover, and the substrate of the sensor package structure has a lower CTE that is less than 10 ppm/° C., thereby effectively preventing warpage of the sensor package structure from occurring and increasing reliability of the sensor package structure.

Moreover, in the sensor package structure of the present disclosure, the gap surrounded by the outer lateral side of the adhesive layer, the substrate, and the bottom side of the annular supporting body is filled with the package body (or each of the elongated supporting bodies), thereby effectively increasing the bonding strength between the glass cover and the substrate.

Further, the substrate of the sensor package structure of the present disclosure is provided with the surrounding wall disposed thereon, so that the volume of the package body can be decreased and stress incurred in the package body can be reduced.

In addition, the annular portion of the glass cover of the sensor package structure in the present disclosure is provided with the at least one hanging segment, so that the metal wires can be arranged under the at least one hanging segment and can be embedded in the at least one protecting body, thereby effectively reducing the size of the sensor package structure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate made of a material with a coefficient of thermal expansion (CTE) that is less than 10 ppm/° C.;
   a sensor chip disposed on the substrate, wherein a top surface of the sensor chip has a sensing region;

a plurality of metal wires electrically connecting the substrate and the sensor chip;
a glass cover including:
  a board body having a light-permeable portion and an annular portion arranged around the light-permeable portion; and
  an annular supporting body connected to the annular portion of the board body, wherein the annular supporting body of the glass cover is disposed on the substrate, the glass cover and the substrate jointly surround an enclosed accommodating space, the sensor chip and the metal wires are arranged in the accommodating space, and the sensing region of the sensor chip faces the light-permeable portion of the board body;
an adhesive layer connecting the annular supporting body to the substrate; and
a package body disposed on the substrate, wherein the package body is arranged around the glass cover and the adhesive layer, and the light-permeable portion of the glass cover is exposed from the package body,
wherein an outer lateral side of the adhesive layer is retracted from an outer lateral side of the annular supporting body by a distance, so that a gap is formed among the outer lateral side of the adhesive layer, the substrate, and a bottom side of the annular supporting body, and wherein the package body is filled within the gap so as to connect the outer lateral side of the adhesive layer, the substrate, and the bottom side of the annular supporting body.

2. The sensor package structure according to claim 1, wherein an outer lateral side of the annular portion protrudes from the annular supporting body, and at least part of the outer lateral side of the annular portion is covered by the package body.

3. The sensor package structure according to claim 1, further comprising a surrounding wall disposed on the substrate, wherein the annular supporting body is arranged inside of the surrounding wall, the annular supporting body and the surrounding wall are spaced out a distance so as to form a filling slot, and the filling slot is fully filled with the package body.

4. The sensor package structure according to claim 1, wherein the substrate has an annular groove, the annular supporting body is disposed in the annular groove, and the adhesive layer is arranged in the annular groove.

5. The sensor package structure according to claim 1, wherein the glass cover includes a bonding layer that connects the board body and the annular supporting body.

6. A sensor package structure, comprising:
a substrate made of a material with a coefficient of thermal expansion (CTE) that is less than 10 ppm/° C.;
a sensor chip disposed on the substrate, wherein a top surface of the sensor chip has a sensing region;
a plurality of metal wires electrically connecting the substrate and the sensor chip;
a glass cover including:
  a board body having a light-permeable portion and an annular portion arranged around the light-permeable portion; and
  an annular supporting body connected to the annular portion of the board body, wherein the annular supporting body of the glass cover is disposed on the substrate, the glass cover and the substrate jointly surround an enclosed accommodating space, the sensor chip and the metal wires are arranged in the accommodating space, and the sensing region of the sensor chip faces the light-permeable portion of the board body;
an adhesive layer connecting the annular supporting body to the substrate;
a package body disposed on the substrate, wherein the package body is arranged around the glass cover and the adhesive layer, and the light-permeable portion of the glass cover is exposed from the package body; and
a surrounding wall disposed on the substrate, wherein the annular supporting body is arranged inside of the surrounding wall, the annular supporting body and the surrounding wall are spaced out a distance so as to form a filling slot, and the filling slot is fully filled with the package body.

7. A sensor package structure, comprising:
a substrate made of a material with a coefficient of thermal expansion (CTE) that is less than 10 ppm/° C.;
a sensor chip disposed on the substrate, wherein a top surface of the sensor chip has a sensing region;
a plurality of metal wires electrically connecting the substrate and the sensor chip;
a glass cover including:
  a board body having a light-permeable portion and an annular portion arranged around the light-permeable portion; and
  an annular supporting body connected to the annular portion of the board body, wherein the annular supporting body of the glass cover is disposed on the substrate, the glass cover and the substrate jointly surround an enclosed accommodating space, the sensor chip and the metal wires are arranged in the accommodating space, and the sensing region of the sensor chip faces the light-permeable portion of the board body;
an adhesive layer connecting the annular supporting body to the substrate, wherein the glass cover includes a bonding layer that connects the board body and the annular supporting body; and
a surrounding wall disposed on the substrate, wherein the annular supporting body is arranged inside of and connected to the surrounding wall, an outer lateral side of the annular portion protrudes from the annular supporting body, and the board body is fixed to the annular supporting body and the surrounding wall through the bonding layer.

* * * * *